(12) United States Patent
Hong et al.

(10) Patent No.: US 9,991,426 B2
(45) Date of Patent: Jun. 5, 2018

(54) LIGHT-EMITTING DEVICE PACKAGE

(71) Applicant: Samsung Electronics Co., Ltd., Suwon-si, Gyeonggi-do (KR)

(72) Inventors: Sung-mok Hong, Asan-si (KR); Kyung-wook Hwang, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days. days.

(21) Appl. No.: 15/401,604

(22) Filed: Jan. 9, 2017

(65) Prior Publication Data

US 2017/0279009 A1    Sep. 28, 2017

(30) Foreign Application Priority Data

Mar. 28, 2016    (KR) .................. 10-2016-0036959

(51) Int. Cl.

| H01L 33/00 | (2010.01) |
|---|---|
| H01L 33/46 | (2010.01) |
| H01L 33/62 | (2010.01) |
| H01L 33/52 | (2010.01) |
| H01L 33/50 | (2010.01) |
| H01L 33/64 | (2010.01) |
| H01L 33/48 | (2010.01) |
| H01L 21/764 | (2006.01) |

(52) U.S. Cl.
CPC ............ *H01L 33/46* (2013.01); *H01L 33/483* (2013.01); *H01L 33/486* (2013.01); *H01L 33/502* (2013.01); *H01L 33/52* (2013.01); *H01L 33/62* (2013.01); *H01L 33/64* (2013.01); *H01L 33/641* (2013.01); *H01L 21/764* (2013.01)

(58) Field of Classification Search
CPC ..... H01L 33/62; H01L 33/641; H01L 33/483; H01L 33/486; H01L 21/764
USPC ............................................. 257/98, 99, 100
See application file for complete search history.

(56) References Cited

U.S. PATENT DOCUMENTS

| 6,372,608 | B1 | 4/2002 | Shimoda et al. |
|---|---|---|---|
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |

(Continued)

FOREIGN PATENT DOCUMENTS

| KR | 100865487 B1 | 10/2008 |
|---|---|---|
| KR | 2013/0017464 A | 2/2013 |

(Continued)

*Primary Examiner* — David Vu
*Assistant Examiner* — Brandon Fox
(74) *Attorney, Agent, or Firm* — Harness, Dickey & Pierce, P.L.C.

(57) ABSTRACT

A light-emitting device package includes a supporting substrate, a light-emitting device on the supporting substrate, an adhesive layer on at least a portion of a side surface or lower surface of the light-emitting device, the adhesive layer connecting the light-emitting device to the supporting substrate, and an air layer in a space defined by the supporting substrate, the light-emitting device, and the adhesive layer.

18 Claims, 26 Drawing Sheets

(56) References Cited

U.S. PATENT DOCUMENTS

| | | |
|---|---|---|
| 7,087,932 B2 | 8/2006 | Okuyama et al. |
| 7,154,124 B2 | 12/2006 | Han et al. |
| 7,208,725 B2 | 4/2007 | Sherrer et al. |
| 7,262,440 B2 | 8/2007 | Choi et al. |
| 7,288,758 B2 | 10/2007 | Sherrer et al. |
| 7,319,044 B2 | 1/2008 | Han et al. |
| 7,482,696 B2 | 1/2009 | Shei et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 7,999,280 B2 | 8/2011 | Kim et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,772,790 B2 * | 7/2014 | Weng ................. H01L 33/44 257/100 |
| 8,878,229 B2 | 11/2014 | Kim et al. |
| 8,900,895 B2 | 12/2014 | Lin et al. |
| 9,666,774 B2 * | 5/2017 | Beppu ................. H01L 33/60 |
| 9,716,061 B2 * | 7/2017 | Palaniswamy .... H01L 23/49838 |
| 2012/0037935 A1 | 2/2012 | Yang |
| 2014/0256071 A1 | 9/2014 | Park et al. |
| 2015/0270336 A1 | 9/2015 | Yeh et al. |
| 2015/0287892 A1 * | 10/2015 | Han ................. H01L 33/505 257/89 |
| 2016/0276543 A1 * | 9/2016 | Hung ................. H01L 33/60 |

FOREIGN PATENT DOCUMENTS

| | | |
|---|---|---|
| KR | 2013/0055121 A | 5/2013 |
| KR | 2015/0030114 A | 3/2015 |
| KR | 2015/0110976 A | 10/2015 |

* cited by examiner

LIGHT-EMITTING DEVICE PACKAGE

CROSS-REFERENCE TO RELATED APPLICATION

This application claims the benefit of Korean Patent Application No. 10-2016-0036959, filed on Mar. 28, 2016, in the Korean Intellectual Property Office, the disclosure of which is incorporated herein in its entirety by reference.

BACKGROUND

The inventive concepts relate to a light-emitting device package, and/or to a light-emitting device package configured to improve light extraction efficiency and reduce deterioration due to heat.

A light-emitting device typically has a long lifetime, low power consumption, and a fast response speed, is environmentally friendly and is used as a light source in a variety of products such as a lighting apparatus or a backlight of a display device. Therefore, a light-emitting device package having improved light extraction efficiency and improved reliability is advantageous.

SUMMARY

The inventive concepts relate to a light-emitting device package having improved light extraction efficiency and improved reliability.

According to an example embodiment of the inventive concepts, a light-emitting device package includes a supporting substrate, a light-emitting device including a transparent substrate on the supporting substrate and a first conductive semiconductor layer, an active layer, and a second conductive semiconductor layer, stacked, for example sequentially stacked on the transparent substrate; an adhesive layer connecting the light-emitting device to the supporting substrate; and an air layer between the supporting substrate and the light-emitting device.

According to an example embodiment of the inventive concepts, a light-emitting device package includes a supporting substrate, a light-emitting device on the supporting substrate, the light-emitting device including a reflective structure, a transparent substrate, and a light-emitting structure, stacked, for example sequentially stacked on the supporting substrate, an adhesive layer on at least a portion of a side surface or lower surface of the light-emitting device, the adhesive layer connecting the light-emitting device to the supporting substrate, an air layer in a space defined by the supporting substrate, the light-emitting device, and the adhesive layer, and an encapsulation member sealing the supporting substrate, the adhesive layer, and the light-emitting device, wherein the encapsulation member is not formed in the air layer.

Example embodiments relate to a light-emitting package including a substrate having a groove at an upper surface thereof, and a light-emitting device on the substrate, the light-emitting device being partially in the groove to define an air layer separating the substrate from the light-emitting device in a direction perpendicular to a surface of the substrate.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
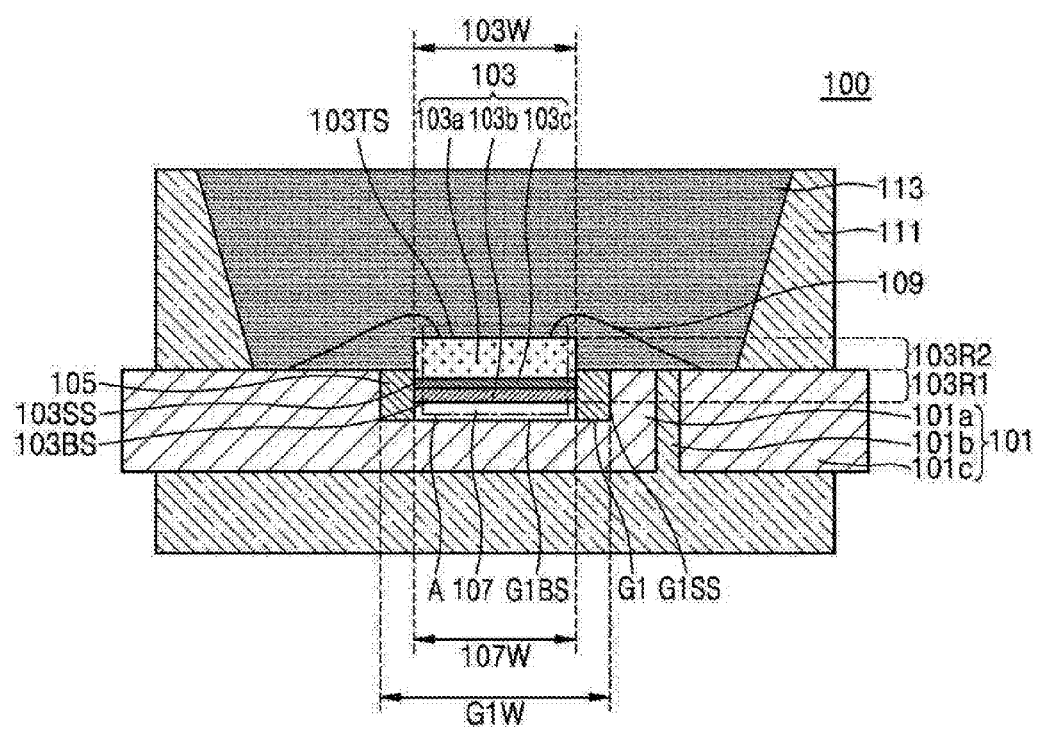
FIG. 1A is a cross-sectional view of a light-emitting device package according to an example embodiment.

These and other features and advantages are described in, or are apparent from, the following detailed description of various example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the example embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the description.

Figure 1B:
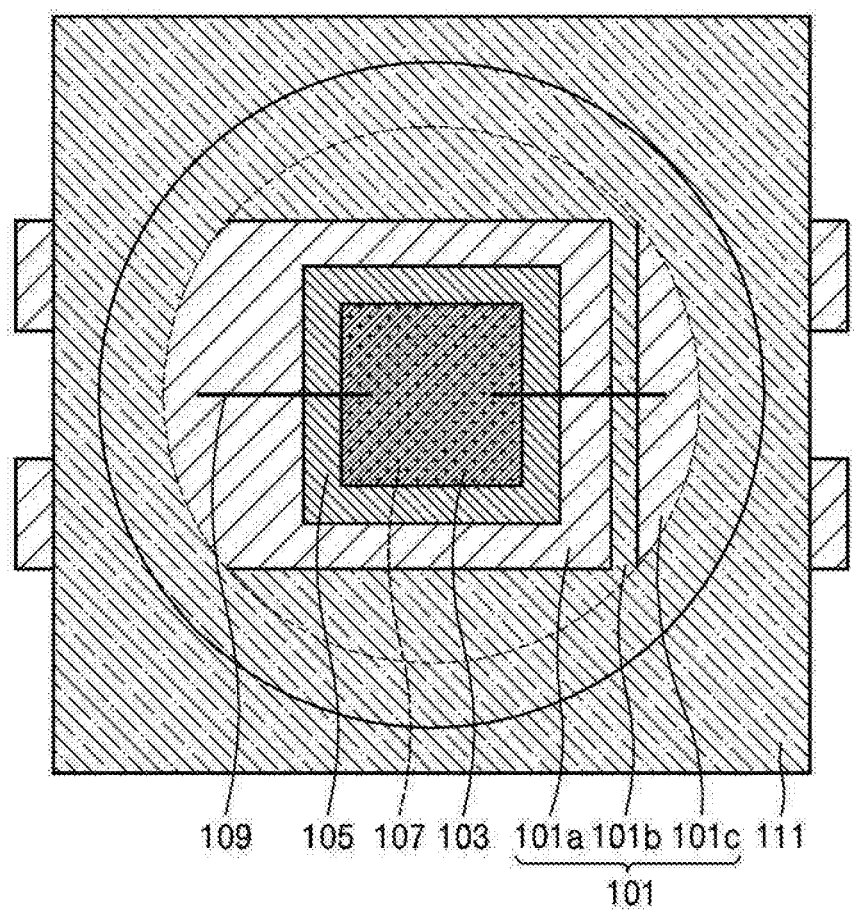
FIG. 1B is a plan view of the light-emitting device package of FIG. 1A.
Figure 2:
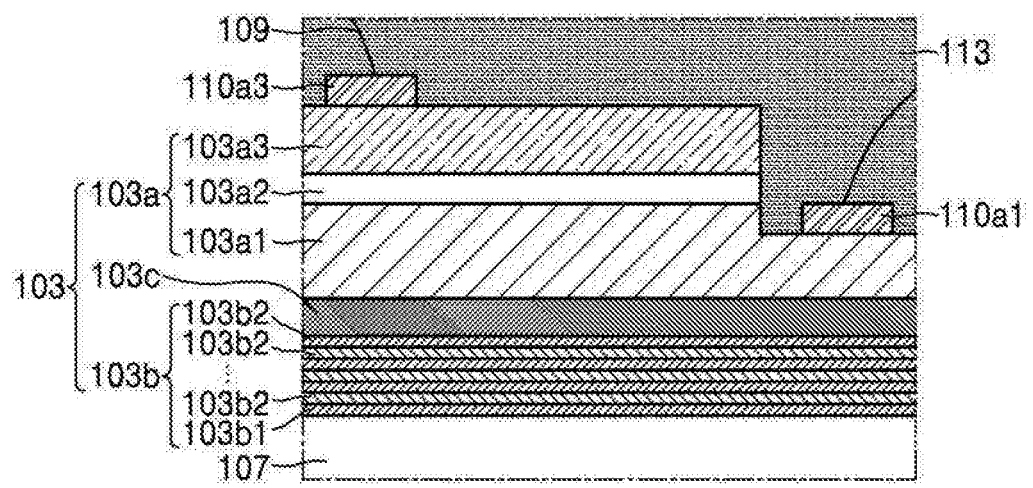
FIG. 2 is an enlarged example view of a region A of FIG. 1A.

FIG. 1A is a cross-sectional view of a light-emitting device package 100 according to an example embodiment, and FIG. 1B is a plan view of the light-emitting device package 100 of FIG. 1A. FIG. 2 is an enlarged example view of a region A of FIG. 1A.

Referring to FIGS. 1A, 1B, and 2, the light-emitting device package 100 may include a supporting substrate 101, a light-emitting device 103 on the supporting substrate 101, an adhesive layer 105 formed on a portion of a side surface 103SS of the light-emitting device 103 to connect the supporting substrate 101 to the light-emitting device 103, an air layer 107 formed in a space that is defined by the supporting substrate 101, the light-emitting device 103, and the adhesive layer 105, a wire 109 for electrically connecting the supporting substrate 101 to the light-emitting device 103, and an encapsulation member 113 for sealing the supporting substrate 101, the adhesive layer 105, the light-emitting device 103, and the wire 109.

In detail, the supporting substrate 101 may include a first lead frame portion 101a configured as a first electrode, a second lead frame portion 101c configured as a second electrode, and a supporting portion 101b supporting the first and second lead frame portions 101a and 101c. The first and second lead frame portions 101a and 101c may be exposed from a side surface of the light-emitting device package 100 and be electrically connected to the outside. The first and second lead frame portions 101a and 101c may include a conductive material. For example, the first and second lead frame portions 101a and 101c may include a metal material, for example, at least one selected from titanium Ti, copper Cu, nickel Ni, gold Au, chrome Cr, tantalum Ta, platinum Pt, tin Sn, silver Ag, phosphorus P, aluminum Al, indium In, palladium Pd, cobalt Co, silicon Si, germanium Ge, hafnium Hf, ruthenium Ru and iron Fe. The first and second lead frame portions 101a and 101c may be electrically separated with the supporting portion 101b therebetween, the supporting portion 101b including an insulating material. At least a portion of the supporting substrate 101 may be treated as, or configured to be, a reflective surface. However, the light-emitting device package 100 according to the example embodiment is not limited to the structure of the supporting substrate 101 of FIGS. 1A and 1B, and may include various lead frame structures, wiring structures, and device structures.

An upper surface of the supporting substrate 101 may include a groove G1. The area of a flat surface of the groove G1 may be greater than the area of the light-emitting device 103 so as to accommodate a portion of the light-emitting device 103.

The light-emitting device 103 may be partially in the groove G1 and be spaced apart from a lower surface G1BS of the groove G1. The air layer 107 may be formed in a space between the lower surface G1BS of the groove G1 and a lower surface 103BS of the light-emitting device 103. The light-emitting device 103 may include a transparent substrate 103c, a light-emitting structure 103a formed on the transparent substrate 103c, and a reflective structure 103b connected to a lower surface of the transparent substrate 103c. The light-emitting structure 103a may be a structure in which a first conductive semiconductor layer 103a1, an active layer 103a2, and a second conductive semiconductor layer 103a3 are stacked, for example sequentially stacked in this stated order. In this case, the transparent substrate 103c may be a growth substrate of the first conductive semiconductor layer 103a1. In FIG. 1A, although the transparent substrate 103c is between the light-emitting structure 103a and the reflective structure 103b, the inventive concepts are not limited thereto. The transparent substrate 103c may be omitted.

The first conductive semiconductor layer 103a1 may include a semiconductor doped with p-type impurities, and the second conductive semiconductor layer 103a3 may include a semiconductor doped with n-type impurities. On the contrary, the first conductive semiconductor layer 103a1 may include a semiconductor doped with n-type impurities, and the second conductive semiconductor layer 103a3 may include a semiconductor doped with p-type impurities. The first and second conductive semiconductor layers 103a1 and 103a3 may include a nitride semiconductor, for example, $Al_xIn_yGa_{(1-x-y)}N$ (0<x<1, 0<y<1, 0<x+y<1). However, the first and second conductive semiconductor layers 103a1 and 103a3 may include a GaAs-based semiconductor or a GaP-based semiconductor, besides the nitride semiconductor. The first conductive semiconductor layer 103a1, the active layer 103a2, and the second conductive semiconductor layer 103a3 may be epitaxial layers.

The active layer 103a2 between the first conductive semiconductor layer 103a1 and the second conductive semiconductor layer 103a3 may emit light having desired, or alternatively predetermined energy through the recombination of electrons and holes. The active layer 103a2 may have a multiple quantum well (MQW) structure in which quantum well layers and quantum barrier layers are stacked, for example alternately stacked in, for example, an InGaN/GaN or AlGaN/GaN structure. In addition, the active layer 103a2 may have a single quantum well (SQW) structure. The light-emitting structure 103a may emit blue light, green light, red light, or ultraviolet rays according to the material of a compound semiconductor forming the light-emitting structure 103a. However, due to a wavelength conversion material of the encapsulation member 113 formed on the light-emitting structure 103a, a wavelength of light produced from the light-emitting structure 103a may be converted and thus light having various colors may be output. The first and second conductive semiconductor layers 103a1 and 103*a*3 may be electrically connected to first and second electrodes 110*a*1 and 110*a*3, respectively.

The first and second electrodes 110*a*1 and 110*a*3 may include a conductive material, for example, at least one selected from Ag, Al, Ni, Cr, and the like. The first and second electrodes 110*a*1 and 110*a*3 may be transparent electrodes including, for example, indium tin oxide (ITO), aluminum zinc oxide (AZO), indium zinc oxide (IZO), ZnO, GZO(ZnO:Ga), $In_2O_3$, $SnO_2$, CdO, $CdSnO_4$, or $Ga_2O_3$. Structures of the first and second electrodes 110*a*1 and 110*a*3 are not limited to the structures shown in FIGS. 1A and 1B, and the first and second electrodes 110*a*1 and 110*a*3 may include various other structures and materials. The first and second electrodes 110*a*1 and 110*a*3 may be electrically connected to the first and second lead frame portions 101*a* and 101*c*, respectively, via the wire 109.

The reflective structure 103*b* formed under the transparent substrate 103*c* may reflect light, which is produced from the light-emitting structure 103*a* and is radiated toward the transparent substrate 103*c*, toward an upper side thereof. The reflective structure 103*b* may include a multilayered structure. For example, the reflective structure 103*b* may include a distributed Bragg reflector (DBR) structure. The reflective structure 103*b* may include a structure in which a first layer 103*b* and a second layer 103*b*2, which include different materials, are arranged, for example alternately arranged at least once. The first and second layers 103*b*1 and 103*b*2 may have different refractive indexes and/or different thicknesses. The reflective structure 103*b* may be designed by selecting the refractive index and thickness of each of, or at least one of, the first and second layers 103*b*1 and 103*b*2 and the number of times, which the first and second layers 103*b*1 and 103*b*2 are repeated, so as to have high reflectivity with respect to the wavelength of light produced by the light-emitting structure 103*a*.

In FIG. 2, although the reflective structure 103*b* has a multilayered structure, the inventive concepts are not limited thereto. The reflective structure 103*b* may include a single material.

Light extraction efficiency may be determined according to a ratio of light radiated toward an upper side (i.e., a light irradiation surface) of the light-emitting structure 103*a* to light produced by the light-emitting structure 103*a*. In general, a significant portion of light produced by the light-emitting structure 103*a* may not be radiated toward an upper side of the light-emitting structure 103*a* but toward a lower side thereof. In this case, light may be absorbed by a structure (e.g., the supporting substrate 101) under the light-emitting structure 103*a*, and thus, light extraction efficiency may be reduced. The reflective structure 103*b* may reflect light radiated toward the lower side of the light-emitting structure 103*a* toward the upper side of the light-emitting structure 103*a*, and thus may reduce light absorption by structures under the light-emitting structure 103*a*.

In a general light-emitting device package, the light-emitting device 103 is fixed to the supporting substrate 101 by an adhesive layer covering the entire lower surface of the light-emitting device 103. In this case, the reflective structure 103*b* of the light-emitting device 103 directly contacts the adhesive layer, and a refractive index difference between the reflective structure 103*b* and the adhesive layer is relatively small and thus a refractive index is changed, for example sequentially changed between the reflective structure 103*b* and the adhesive layer. Accordingly, light radiated toward the lower side of the light-emitting structure 103*a* may not be totally reflected between the reflective structure 103*b* and the adhesive layer and be lost at the lower side of the light-emitting structure 103*a* through sequential light refraction.

As described above, the light-emitting device package 100 according to the example embodiment may include the adhesive layer 105 formed on a portion of the side surface 103SS of the light-emitting device 103 to connect the light-emitting device 103 to the supporting substrate 101. The adhesive layer 105 may be formed or configured to fix the light-emitting device 103 to the supporting substrate 101 and not to directly contact the entire lower surface of the reflective structure 103*b*. That is, the air layer 107 may be formed on the lower surface of the reflective structure 103*b*. Since a refractive index difference between the air layer 107 and the reflective structure 103*b* is large, a total reflection ratio of light increases although the light is radiated toward the lower side of the light-emitting structure 103*a*, and thus light extraction efficiency at the upper side of the light-emitting structure 103*a* may be improved.

For example, when the refractive index of the adhesive layer 105 attached to the entire lower surface of the reflective structure 103*b* is about 1.4 to about 1.5, the total reflection of light between the reflective structure 103*b* and the adhesive layer 105 may occur only by light having an incident angle of about 51° to about 56° or more. More specifically, when the refractive index of the adhesive layer 105 is about 1.4, the total reflection of light between the reflective structure 103*b* and the adhesive layer 105 may occur only by light having an incident angle of about 56° and over. And when the refractive index of the adhesive layer 105 is about 1.5, the total reflection of light between the reflective structure 103*b* and the adhesive layer 105 may occur only by light having an incident angle of about 51° and over. On the other hand, since the refractive index of the air layer 107 contacting the lower surface of the reflective structure 103*b* is 1.0, the total reflection of light between the reflective structure 103*b* and the air layer 107 may occur by light having an incident angle of about 34° or more. In other words, when the air layer 107 is formed on the lower surface of the reflective structure 103*b*, loss of light having an incident angle of about 34° to about 56° may be reduced or prevented, compared to when an adhesive layer is formed on the entire lower surface of the reflective structure 103*b*, and thus, light extraction efficiency may be improved.

In addition, when the air layer 107 is formed on the lower surface of the reflective structure 103*b*, heat from the light-emitting device 103 may be more easily dissipated through the supporting substrate 101, compared to when an adhesive layer is formed on the lower surface of the light-emitting device 103. Accordingly, the deterioration of the reliability of the light-emitting device package 100 due to heat may be reduced or avoided.

In addition, since the light-emitting device 103 has a structure in which the light-emitting device 103 has been inserted into the groove G1 formed in the supporting substrate 101, a difference in the height from the upper surface of the supporting substrate 101 to the upper surface of the light-emitting device 103 may decrease. Accordingly, when the encapsulation member 113 includes a wavelength conversion material 114, light produced by the light-emitting device 103 may be emitted through wavelength conversion even if the wavelength conversion material 114 is deposited in a lower portion of the encapsulation member 113. In addition, as the difference in the height from the upper surface of the supporting substrate 101 to the upper surface of the light-emitting device 103 decreases, the thickness of the encapsulation member 113 sealing the light-emitting device 102 may be reduced. Accordingly, light loss that is caused by light absorption of the encapsulation member 113 may also be reduced.

Although not illustrated in FIG. 1A, in some example embodiments, a growth substrate may be further formed on the lower surface of the reflective structure 103b.

The adhesive layer 105 that connects the light-emitting device 103 to the supporting substrate 101 may be formed along an inner side surface G1SS of the groove G1 of the supporting substrate 101. Specifically, the light-emitting device 103 may be divided into a first region 103R1 inserted into the groove G1 and a second region 103R2 not inserted into the groove G1. In this case, the adhesive layer 105 may be formed in a loop shape surrounding the first region 103R1 between the side of the first region 103R1 of the light-emitting device 103 and the inner side surface G1SS of the groove G1. Accordingly, the air layer 107 may contact the entire lower surface 103BS of the light-emitting device 103. The adhesive layer 105 may include a semiconductor material, for example, silicon (Si). However, the adhesive layer 105 is not limited thereto. Also, the adhesive layer 105 may include a metal. However, the adhesive layer 105 is not limited thereto.

In FIGS. 1A and 1B, although the light-emitting device 103 is fixed to the supporting substrate 101 by the adhesive layer 105 formed on a portion of the side surface of the light-emitting device 103, the inventive concepts are not limited thereto. Referring to FIGS. 8A to 10 that will be described below, the light-emitting device 103 may be fixed to a supporting substrate 201 or 301 by an adhesive layer 205 or 305 formed on a portion of the lower surface of the light-emitting device 103. Details will be described below with reference to FIGS. 8A to 10.

A supporting structure 111 may be on the supporting substrate 101 and surround the light-emitting device 103. The supporting structure 111 may have a cavity structure that has a diameter, which gradually decreases from an upper portion of the supporting structure 111 toward a lower portion thereof, and exposes the upper surfaces of the first and second lead frames 101a and 101c. The width of the cavity may be greater than the width of the light-emitting device 103, and the height of the cavity may be greater than the height of the light-emitting device 103. The inner side surface of the supporting structure 111 may have an incline plane. According to an angle of the incline plane of the inner side surface of the supporting structure 111, the angle of reflection of light that is emitted from the light-emitting device 103 may vary, and the angle of beam spread of light that is emitted to the outside may be adjusted. The supporting structure 111 may include at least one selected from a resin material (e.g., polyphthalamide (PPA)), silicon (Si), aluminum (Al), aluminum nitride (AlN), liquid crystal polymer (e.g., photo sensitive glass (PSG)), polyamide 9T (PA9T), syndiotactic polystyrene (SPS), a metal material, sapphire (Al$_2$O$_3$), and beryllium oxide (BeO). The supporting structure 111 may be formed by an injection molding process, an etching process, or the like. However, the inventive concepts are not limited.

The inside of the supporting structure 111 may be substantially filled with the encapsulation member 113 that seals the light-emitting device 103 and the wire 109 on the supporting substrate 101. The encapsulation member 113 may isolate the light-emitting device 103 from the outside to protect the light-emitting device 103 from external impact and contamination.

In FIGS. 1A and 1B, although the upper surface of the encapsulation member 113 is flat, the inventive concepts are not limited thereto. The upper surface of the encapsulation member 113 may have a convex shape or a concave shape. The encapsulation member 113 may include silicon, epoxy, and/or any other resin material, which has excellent water tightness, corrosion resistance, and insulating properties, or may be formed by an ultraviolet or thermal curing method.

The encapsulation member 113 may include a wavelength conversion material for converting the wavelength of light. The wavelength conversion material may convert the wavelength of light produced from the light-emitting device 103 so that white light is implemented in the light-emitting device package 100. The wavelength conversion material of the encapsulation member 113 will be described below with reference to FIG. 15.

The encapsulation member 113 may further include a light dispersion material that disperses light produced by the light-emitting device 103. The light dispersion material may be provided as metal particles. When the light dispersion material includes a metal, the light extraction efficiency of the light-emitting device package 100 may be improved by surface plasmon resonance.

Figure 3A:
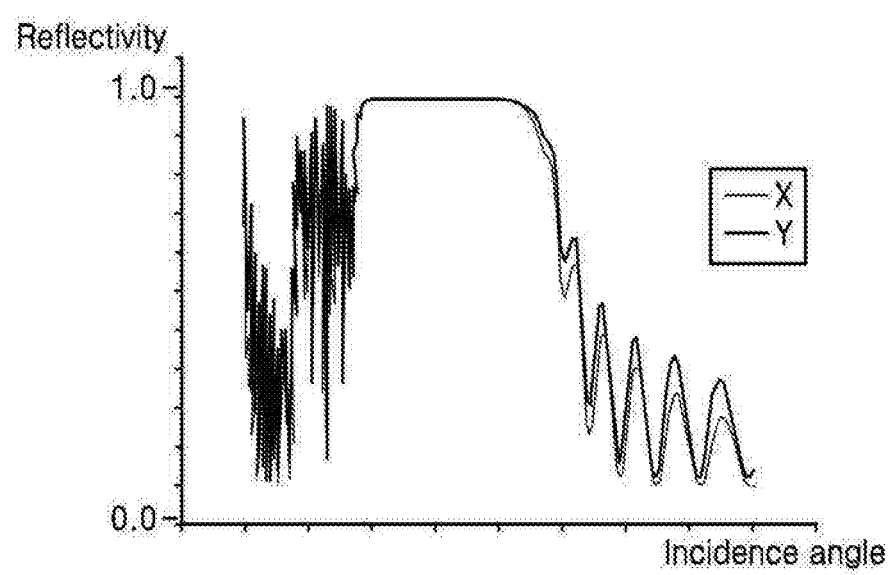
FIG. 3A is a graph illustrating reflectivity according to a wavelength when light produced by a light-emitting structure is vertically incident on a reflective structure.
Figure 3B:
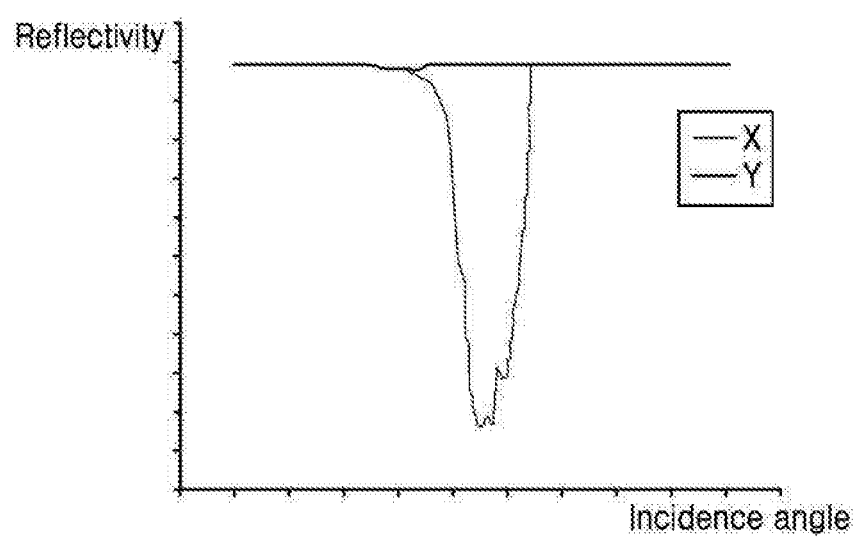
FIG. 3B is a graph illustrating reflectivity according to an incidence angle at which light produced by a light-emitting structure is incident on a reflective structure.

FIG. 3A is a graph illustrating reflectivity according to a wavelength when light produced by a light-emitting structure is vertically incident on a reflective structure having a multilayered structure. FIG. 3B is a graph illustrating reflectivity according to an incidence angle at which light produced by a light-emitting structure is incident on a reflective structure. A comparison example X corresponds to a case in which an adhesive layer, instead of an air layer, is formed on the entire lower surface of the reflective structure 103b, and an example embodiment Y corresponds to a case in which the air layer 107 is formed under the reflective structure 103b.

Referring to FIGS. 1A, 1B, and 3A, the comparison example X and the example embodiment Y have high reflectivity in a specific wavelength band and have low reflectivity in a wavelength band other than the specific wavelength band. In addition, light reflectivity according to the wavelength is similar or the same between the comparison example X and the example embodiment Y regardless of a structural difference between the comparison example X and the example embodiment Y.

Referring to FIG. 3B, in the comparison example X, the light reflectivity of a reflective structure remarkably decreases in a specific incident angle range. On the other hand, in the example embodiment Y, the light reflectivity of the reflective structure 103b is high regardless of an incident angle range.

That is, as described above with reference to FIGS. 1A and 1B, the light-emitting device package 100 may include the air layer 107 under the reflective structure 103b and thus the light reflectivity of the reflective structure 103b of the light-emitting device package 100 may be maintained high.

Figure 4:
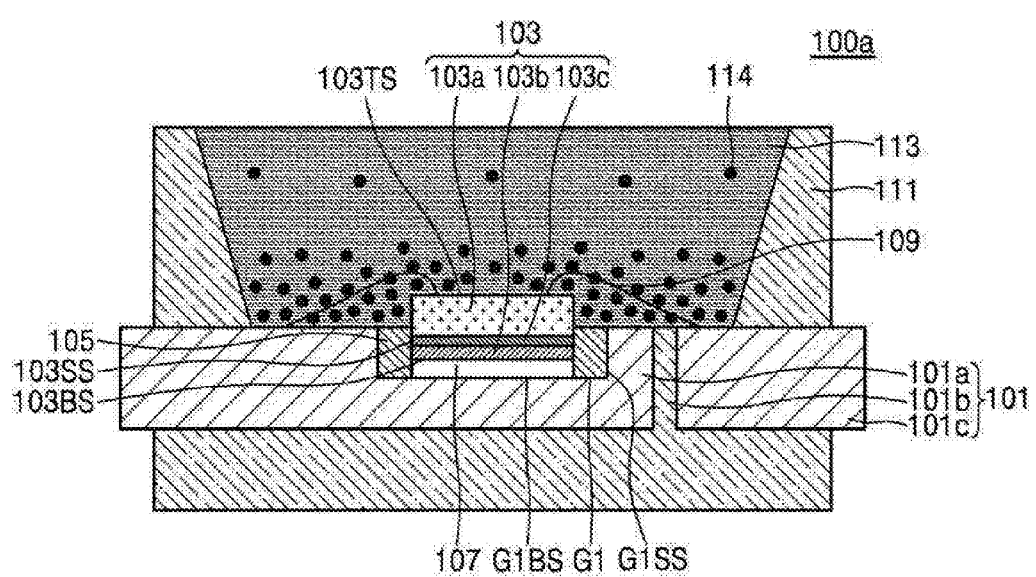
FIG. 4 is a diagram illustrating the distribution of a wavelength conversion material included in an encapsulation member of FIGS. 1A and 1B.

FIG. 4 is a cross-sectional view of a light-emitting device package 100a according to an example embodiment. The light-emitting device package 100a is similar to or the same as the light-emitting device package 100 of FIGS. 1A and 1B. However, the light-emitting device package 100a is different from the light-emitting device package 100 in that an encapsulation member 113 of the light-emitting device package 100a includes an unevenly distributed wavelength conversion material 114. Repeated Descriptions already provided above with reference to FIGS. 1A and 1B will be omitted.

Referring to FIG. 4, since a light-emitting device 103 has a structure in which the light-emitting device 103 has been inserted into a groove G1 formed in a supporting substrate 101, a difference in the height from the upper surface of the supporting substrate 101 to the upper surface of the light-emitting device 103 may decrease.

Accordingly, when the encapsulation member 113 includes the wavelength conversion material 114, the light-emitting device 103 and the wavelength conversion material 114 may sufficiently contact each other even if the wavelength conversion material 114 is deposited in a lower portion of the encapsulation member 113. Accordingly, since most of light produced by the light-emitting device 103 is emitted through wavelength conversion, a light leakage phenomenon, in which light in an undesired wavelength band is emitted, may be reduced.

Figure 5:
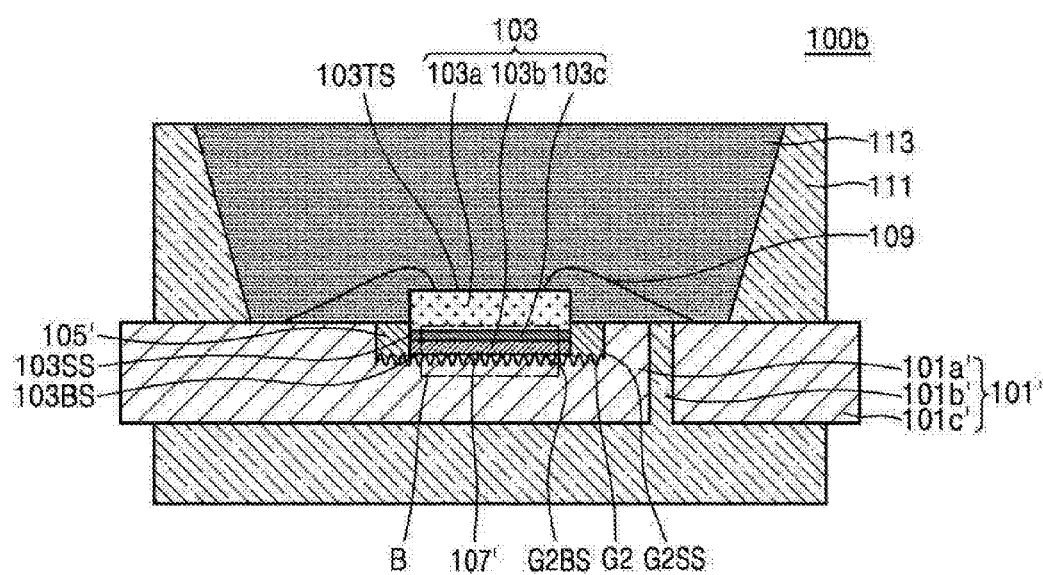
FIG. 5 is a cross-sectional view of a light-emitting device package according to an example embodiment.
Figure 6:
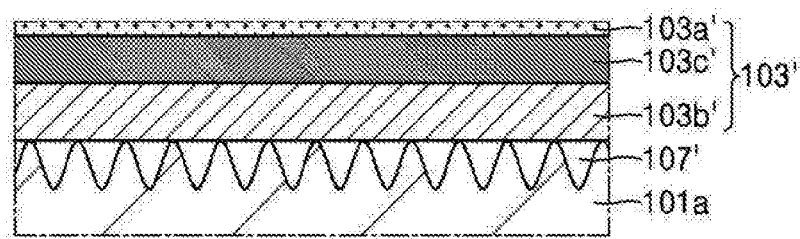
FIG. 6 is an enlarged example view of a region B of FIG. 5, illustrating the lower surface of a groove.

FIG. 5 is a cross-sectional view of a light-emitting device package 100b according to an example embodiment. The light-emitting device package 100b is similar to or the same as the light-emitting device package 100 of FIGS. 1A and 1B. However, the light-emitting device package 100b is different from the light-emitting device package 100 in that a lower surface G2BS of a groove G2 of the light-emitting device package 100b includes irregularities. FIG. 6 is an enlarged example view of a region B of FIG. 5, illustrating the groove G2 in detail.

Referring to FIG. 5, the lower surface G2BS of the groove G2 formed in the upper surface of a supporting substrate 101' may include irregularities. The irregularities may be formed by a mechanical or chemical process for forming the groove G2. Specifically, the lower surface G2BS of the groove G2 may include convex portions and concave portions between the convex portions.

The light-emitting device 103 may be partially inserted in the groove G2. In this case, a lower surface 103BS of the light-emitting device 103 may be on the convex portions of the groove G2. Accordingly, an air layer 107' may be formed in a space that is defined by the lower surface 103BS of the light-emitting device 103 and the concave portions of the groove G2. Accordingly, the entire lower surface 103BS of the light-emitting device 103 contacts the air layer 107'. Since a refractive index difference between the air layer 107' and a reflective structure 103b is large, a total reflection ratio of light increases although the light is radiated toward the lower side of a light-emitting structure 103a, and thus light extraction efficiency at the upper side of the light-emitting structure 103a may be improved.

In addition, heat from the light-emitting device 103 may be easily dissipated through the supporting substrate 101', and thus, the deterioration of the light-emitting device package 100b may be reduced. Furthermore, as a height difference between the upper surface of the supporting substrate 101' and the upper surface of the light-emitting device 103 is reduced, a light leakage phenomenon and light loss that is caused by an encapsulation member 113 may be reduced.

An adhesive layer 105' may be formed on the irregularities of the lower surface G2BS of the groove G2 and cover an inner side surface G2SS of the groove G2. As described above, the adhesive layer 105' may fix the light-emitting device 103 to the supporting substrate 101'.

Figure 7:
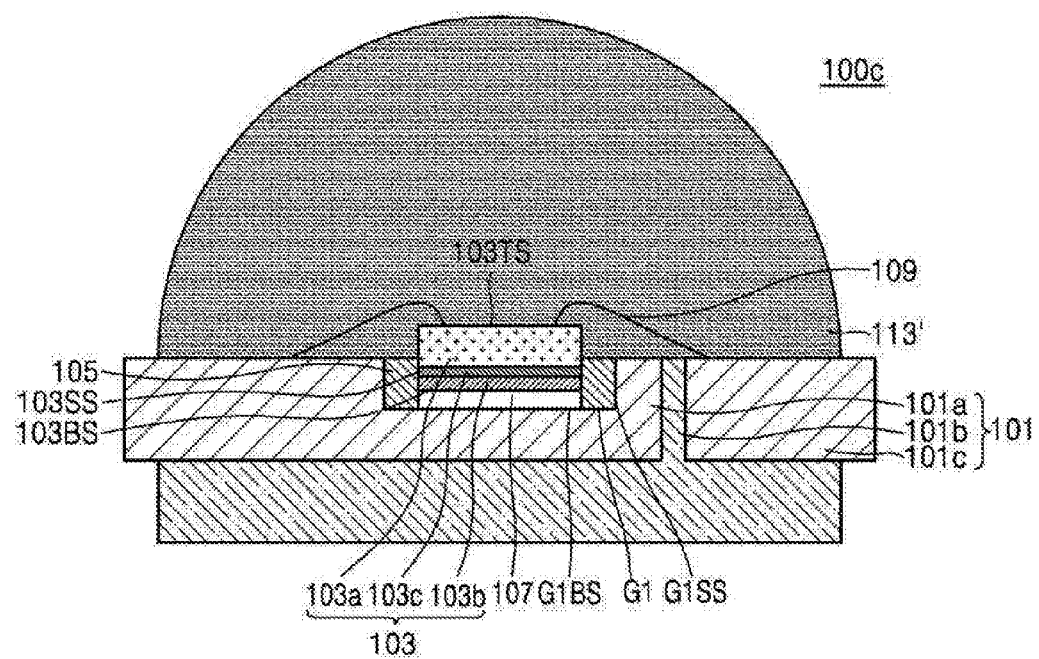
FIG. 7 is a cross-sectional view of a light-emitting device package according to an example embodiment.

FIG. 7 is a cross-sectional view of a light-emitting device package 100c according to an example embodiment. The light-emitting device package 100c is similar to or the same as the light-emitting device package 100 of FIGS. 1A and 1B. However, the light-emitting device package 100c does not include the supporting structure 111 of FIGS. 1A and 1B, and the shape of an encapsulation member 113' of the light-emitting device package 100c is different from that of the encapsulation member 113 of the light-emitting device package 100.

Referring to FIG. 7, the light-emitting device package 100c may include a supporting substrate 101, a light-emitting device 103, an adhesive layer 105, a wire 109, and the encapsulation member 113' for sealing the supporting substrate 101, the light-emitting device 103, the adhesive layer 105, and the wire 109. The encapsulation member 113' may be formed in a hemispherical shape to have a lens configuration and thus may provide a wide angle of beam spread. Since the light-emitting device package 100c does not include a supporting structure, the total thickness and width of the light-emitting device package 100c may be reduced.

In FIG. 7, although the encapsulation member 113' has a hemispherical shape, the inventive concepts are not limited thereto. The shape of the surface of the encapsulation member 113' may be variously selected to correspond to an angle of beam spread which is required by the light-emitting device package 100c.

The encapsulation member 113' may further include a wavelength conversion material and/or a light dispersion material, as described above.

Figure 8A:
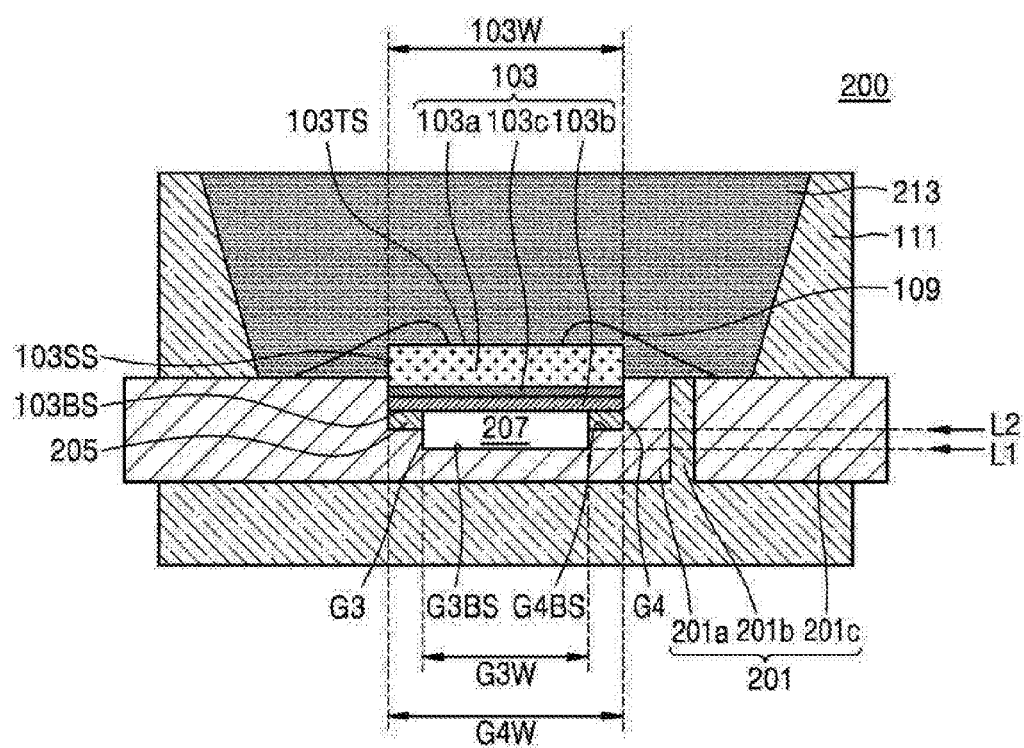
FIG. 8A is a cross-sectional view of a light-emitting device package according to an example embodiment.
Figure 8B:
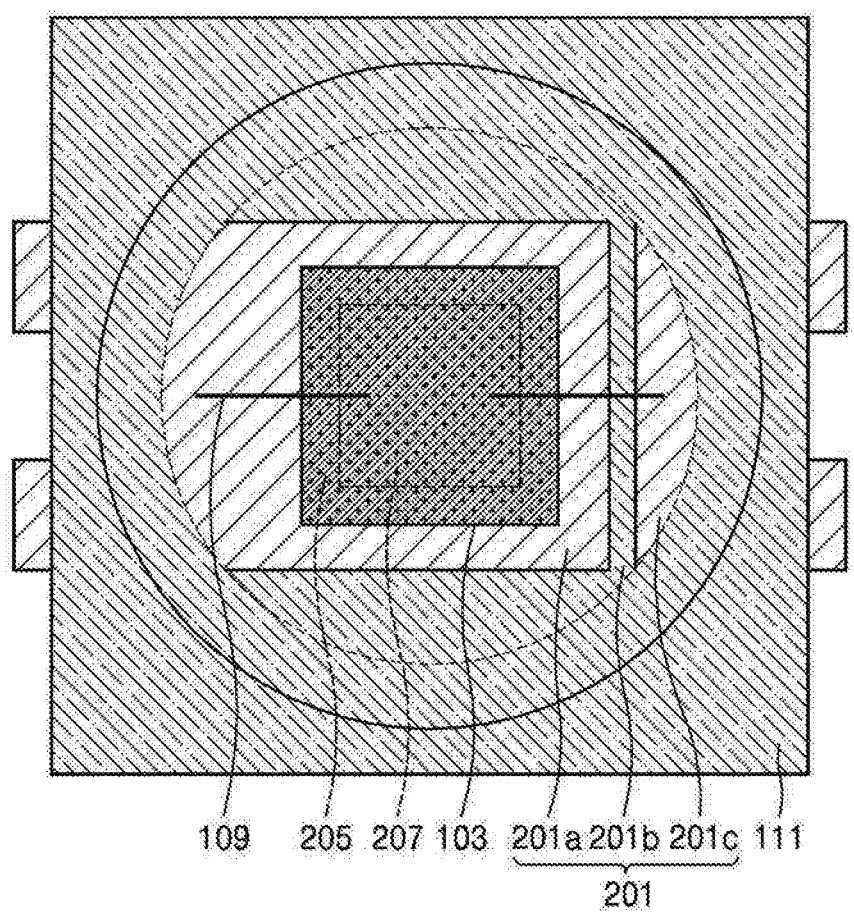
FIGS. 8B and 8C are plan views of the light-emitting device package of FIG. 8A.
Figure 8C:
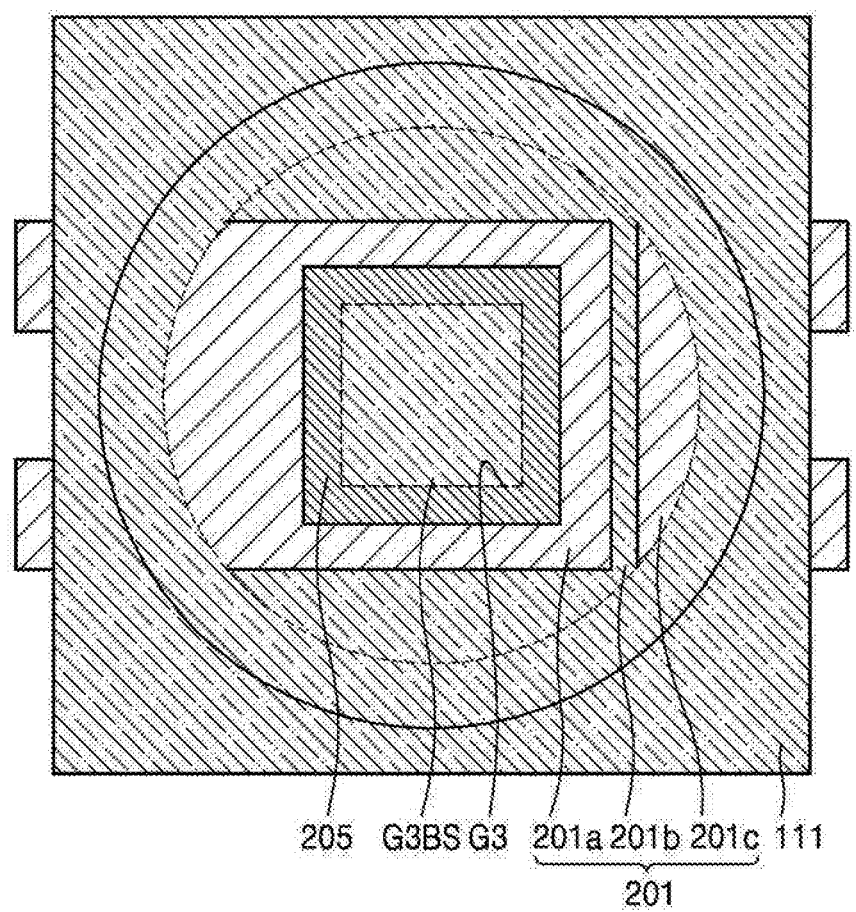

FIG. 8A is a cross-sectional view of a light-emitting device package 200 according to an example embodiment, and FIGS. 8B and 8C are plan views of the light-emitting device package 200. The light-emitting device package 200 is similar to or the same as the light-emitting device package 100 of FIGS. 1A and 1B. However, unlike in the light-emitting device package 100, a supporting substrate 201 includes a first groove G3 and a second groove G4 and a light-emitting device 103 is in the second groove G4. FIG. 8C is a plan view of the light-emitting device package 200 in which the light-emitting device 103 has been omitted.

Referring to FIGS. 8A to 8C, the supporting substrate 201 may include the first groove G3 and the second groove G4, which have different widths and different depths. The first and second grooves G3 and G4 may overlap each other in a direction substantially perpendicular to a main surface of the supporting substrate 201, and thus, the inner side surfaces of the first and second grooves G3 and G4 may have stair shapes. In detail, the first groove G3 has a first width G3W and a first lower surface G3BS at a first level L1. The second groove G4 has a second width G4W that is wider than the first width G3W, and has a second lower surface G4BS at a second level L2 that is higher than the first level L1. In this case, the second width G4W of the first groove G4 may be substantially equal to a width 103W of the light-emitting device 103.

The light-emitting device 103 may be on the second lower surface G4BS of the second groove G4. The side surface 103SS of the light-emitting device 103 may contact the inner side surface of the second groove G4.

An adhesive layer 205 may be between the light-emitting device 103 and the second lower surface G4BS of the second groove G4. Accordingly, the adhesive layer 205 may have a loop shape including an opening. The adhesive layer 205 may fix a gap between the second lower surface G4BS of the second groove G4 and the lower surface 103BS of the light-emitting device 103. In other words, a portion of an edge of the lower surface 103BS of the light-emitting device 103 contacts the adhesive layer 205, and a central portion of the lower surface 103BS of the light-emitting device 103 contacts an air layer 207 formed by the first groove G3.

As described above, since a refractive index difference between the air layer 207 and a reflective structure 103b of the light-emitting device 103 is large, a total reflection ratio of light increases although the light is radiated toward the lower side of a light-emitting structure 103a, and thus light extraction efficiency at the upper side of the light-emitting structure 103a may be improved. In addition, heat from the light-emitting device 103 may be easily dissipated through the supporting substrate 201, and thus, the deterioration of the light-emitting device package 200 may be reduced. Furthermore, as a height difference between the upper surface of the supporting substrate 201 and the upper surface of the light-emitting device 103 is reduced, a light leakage phenomenon and light loss that is caused by an encapsulation member 213 may be reduced.

Figure 9A:
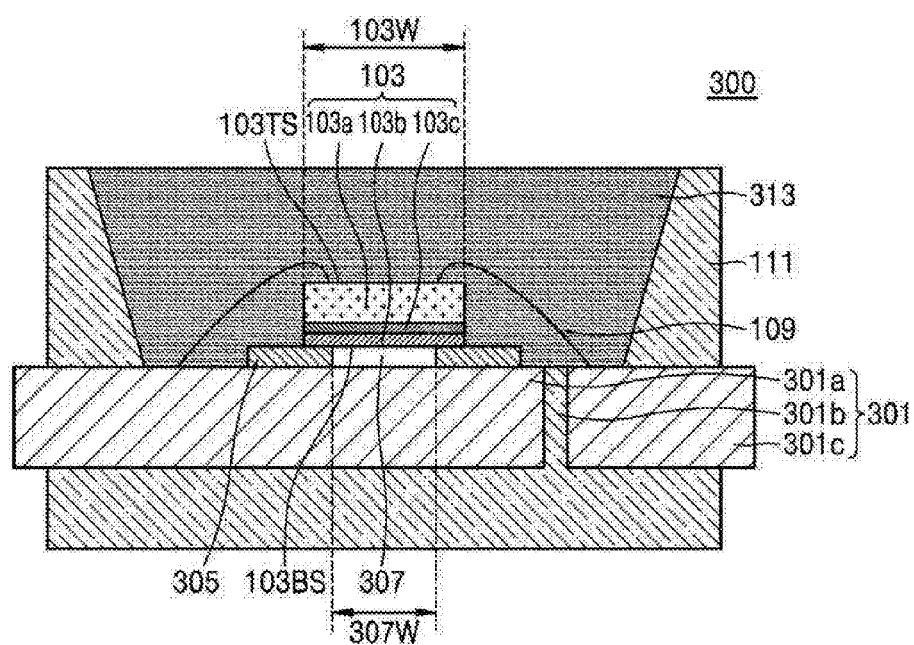
FIG. 9A is a cross-sectional view of a light-emitting device package according to an example embodiment.
Figure 9B:
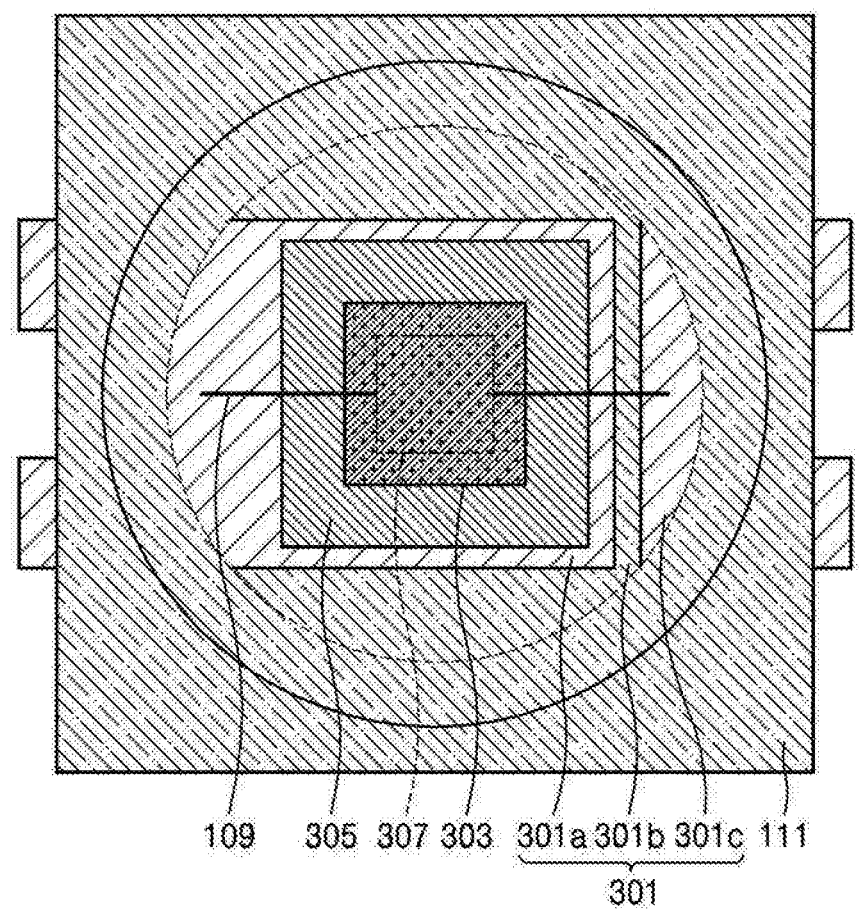
FIGS. 9B and 9C are plan views of the light-emitting device package of FIG. 9A.
Figure 9C:
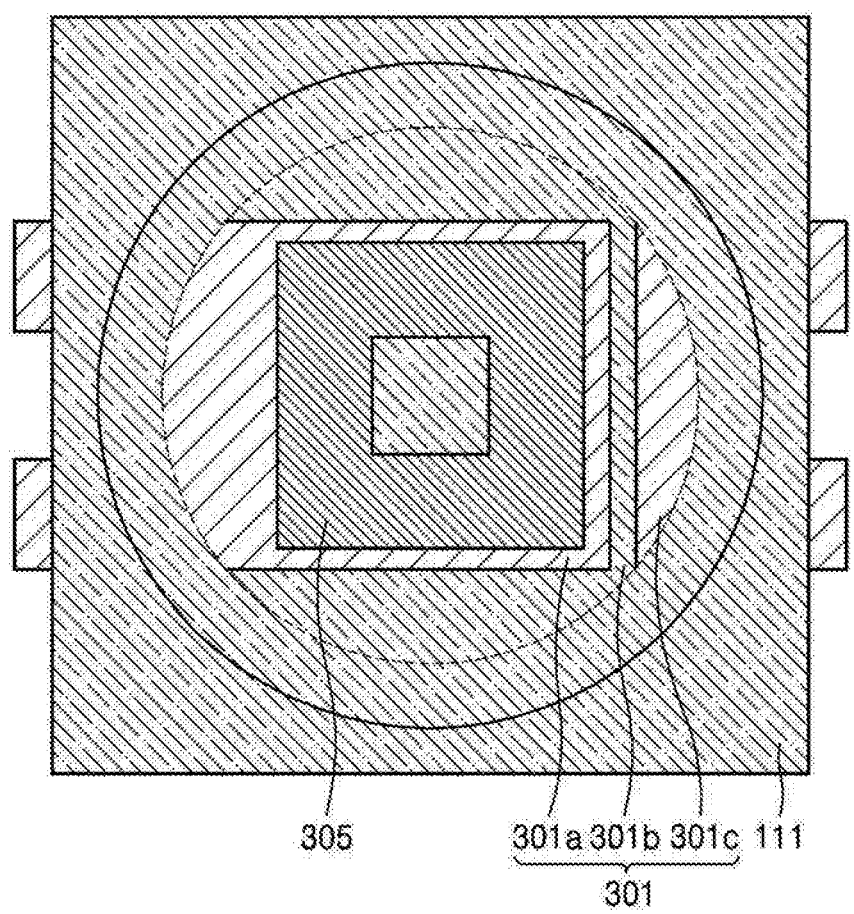

FIG. 9A is a cross-sectional view of a light-emitting device package 300 according to an example embodiment, and FIGS. 9B and 9C are plan views of the light-emitting device package 300. The light-emitting device package 300 is similar to or the same as the light-emitting device package 100 of FIGS. 1A and 1B. However, unlike in the light-emitting device package 100, an air layer 307 is formed on a supporting substrate 301. FIG. 9C is a plan view of the light-emitting device package 300 in which a light-emitting device 103 has been omitted.

Referring to FIGS. 9A to 9C, an adhesive layer 305 having a loop shape including an opening may be formed on the supporting layer 301. The area of a flat surface of the opening of the adhesive layer 305 may be less than the area of the light-emitting device 103. The light-emitting device 103 may be on the adhesive layer 305 and cover the opening.

An air layer 307 may be formed in a space that is defined by the supporting substrate 301, the adhesive layer 305, and the light-emitting device 103. Accordingly, a central portion of a reflective structure 103b of the light-emitting device 103 may contact the air layer 307. In this case, since an edge portion of the light-emitting device 103 contacts the adhesive layer 305, a width 307W of the air layer 307 may be less than the width 103W of the light-emitting device 103. In other words, the area of a flat surface of the air layer 307 may be less than the area of the light-emitting device 103.

The area of a flat surface of the air layer 307 may be greater than the area of a flat surface at which the light-emitting device 103 and the adhesive layer 305 contact each other. As a contact area between the lower surface of the light-emitting device 103 and the air layer 307 increases, light reflectivity of the reflective structure 103b increases, and thus, light extraction efficiency may be improved.

Figure 10:
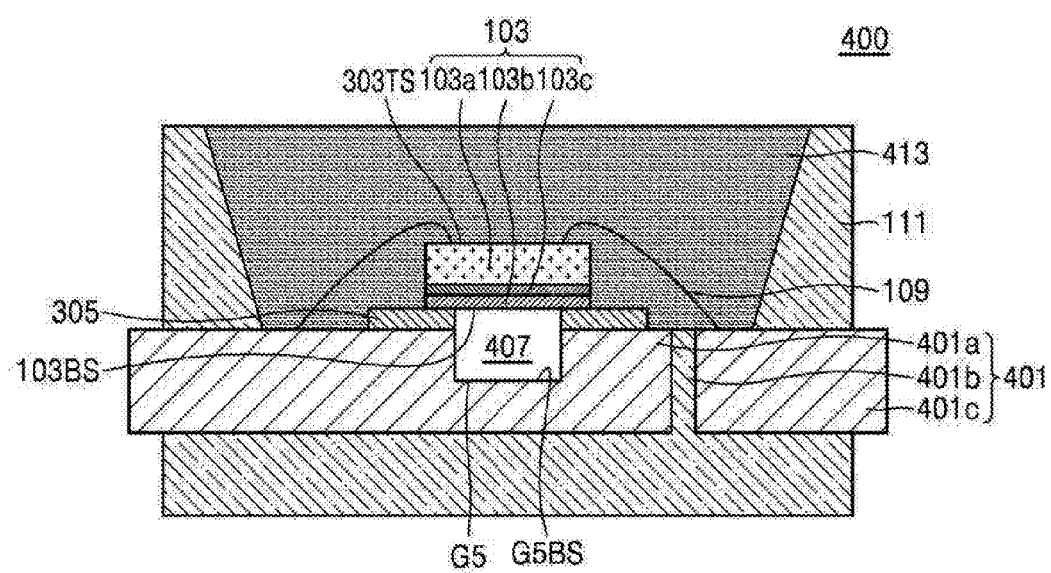
FIG. 10 is a cross-sectional view of a light-emitting device package according to an example embodiment.

FIG. 10 is a cross-sectional view of a light-emitting device package 400 according to an example embodiment. The light-emitting device package 400 is similar to or the same as the light-emitting device package 300 of FIGS. 9A and 9C. However, unlike in the light-emitting device package 300, a groove G5 is further formed in a supporting substrate 401.

Referring to FIG. 10, the supporting substrate 401 may further include the groove G5 that communicates with an opening of an adhesive layer 305 formed on the supporting substrate 401. Accordingly, an air layer 407, which is defined by the lower surface and the inner side surface of the groove G5, the adhesive layer 305, and a light-emitting device 103, may be formed.

Figure 11A:
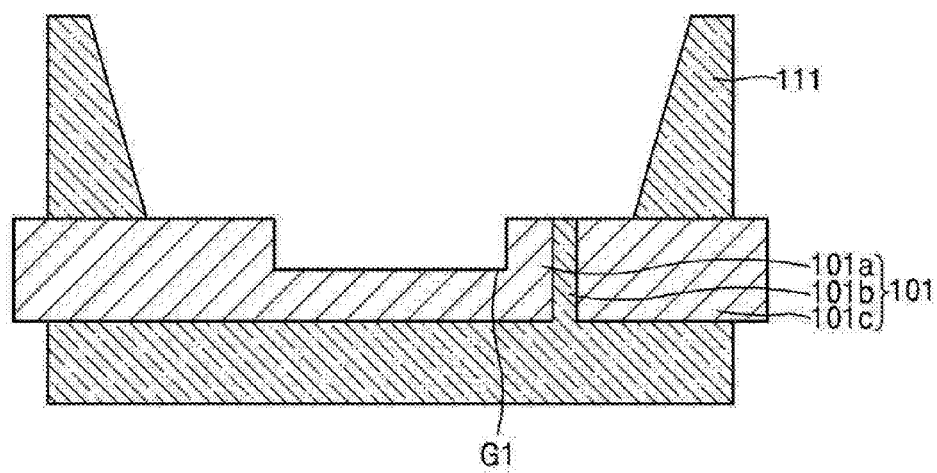
FIGS. 11A to 11C are cross-sectional views that sequentially illustrate a method of manufacturing the light-emitting device package of FIGS. 1A and 1B.
Figure 11B:
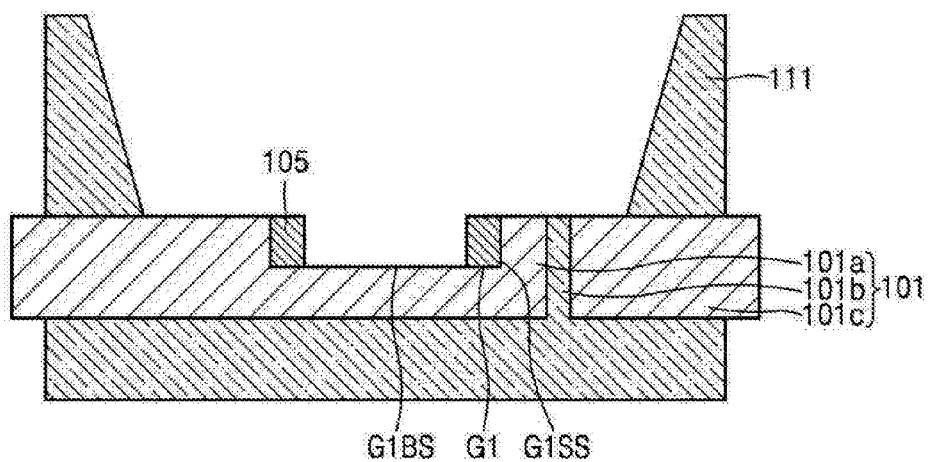
Figure 11C:
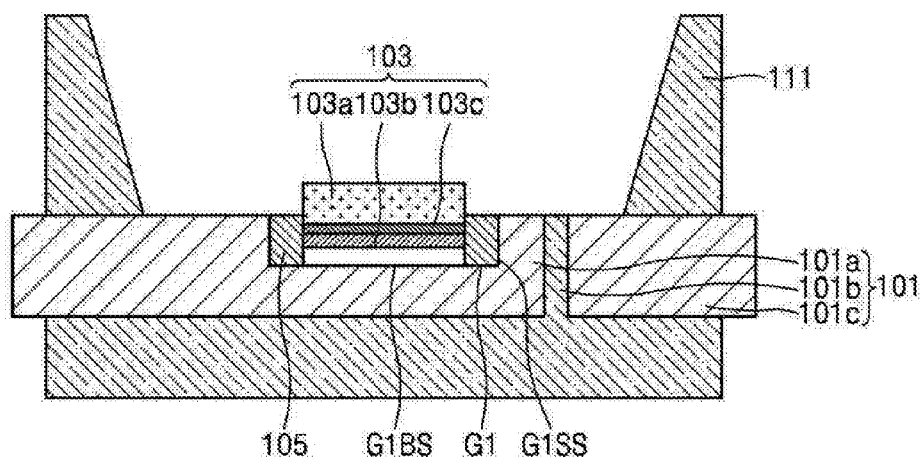

FIGS. 11A to 11C are cross-sectional views that sequentially illustrate a method of manufacturing the light-emitting device package 100 of FIGS. 1A and 1B.

Referring to FIG. 11A, a supporting substrate 101 is prepared, the supporting substrate 101 including first and second lead frame portions 101a and 101c and a supporting portion 101b for separating and supporting the first and second frames 101a and 101c. A supporting structure 111 may be formed on the supporting substrate 101. The supporting structure 111 may be formed by an injection molding process, an etching process, or the like. However, the inventive concepts are not limited.

A groove G1 may be formed in the supporting substrate 101 by using a mechanical or chemical process. The groove G1 may be formed in the first lead frame portion 101a having a relatively large area.

Referring to FIG. 11B, an adhesive layer 105 may be formed by coating an adhesive material on the inner side surface G1SS of the groove G1.

Referring to FIG. 11C, a light-emitting device 103 may be partially inserted in the groove G1 formed in the adhesive layer 105. Since the side surface of the light-emitting device 103 is fixed by the adhesive layer 105, the light-emitting device 103 may be located to be spaced apart from the lower surface G1BS of the groove G1. Accordingly, an air layer 107 may be formed in a space that is defined by the lower surface G1BS of the groove G1, the adhesive layer 105, and the light-emitting device 103.

Next, referring back to FIGS. 1A and 1B, a wire bonding process may be performed to electrically connect the light-emitting device 103 to the supporting substrate 101. In this case, since the light-emitting device 103 is fixed to the supporting substrate 101 via the adhesive layer 105, the light-emitting device 103 may have a stable structure even while the wire bonding process is performed.

Next, the encapsulation member 113 for sealing the light-emitting device 103, the adhesive layer 105, and the wire 109 may be formed in the supporting structure 111 to thereby manufacture the light-emitting device package 100.

The light-emitting device package 100a of FIG. 4 may also be manufactured based on the method described with reference to FIGS. 11A to 11C. However, unlike in the method described with reference to FIGS. 11A to 11C, the encapsulation member 113 of the light-emitting device package 100a of FIG. 4 is formed after the wavelength conversion material 114 is mixed with a molding material.

The light-emitting device package 100c of FIG. 7 may also be manufactured based on the method described with reference to FIGS. 11A to 11C. However, unlike in the method described with reference to FIGS. 11A to 11C, the encapsulation member 113' of the light-emitting device package 100c of FIG. 7, which seals the light-emitting device 103, the adhesive layer 105, and the wire 109, is formed without the supporting structure 111.

Figure 12A:
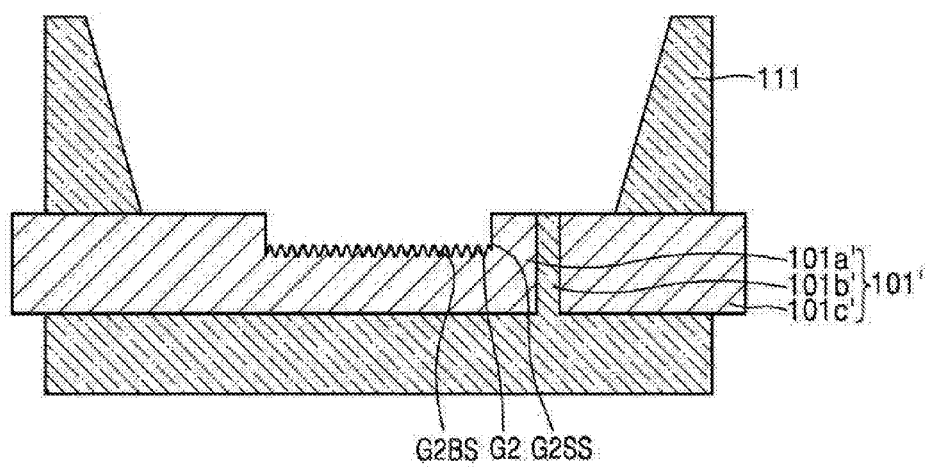
FIGS. 12A to 12C are cross-sectional views that sequentially illustrate a method of manufacturing the light-emitting device package of FIG. 5.
Figure 12B:
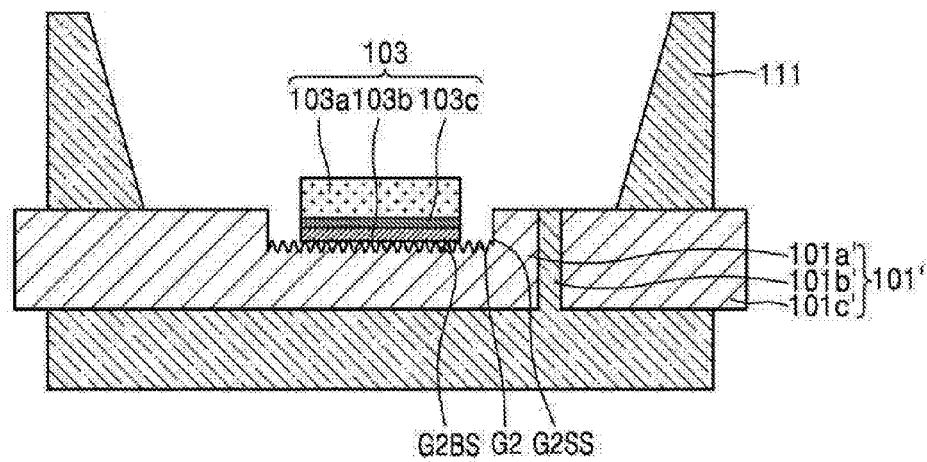
Figure 12C:
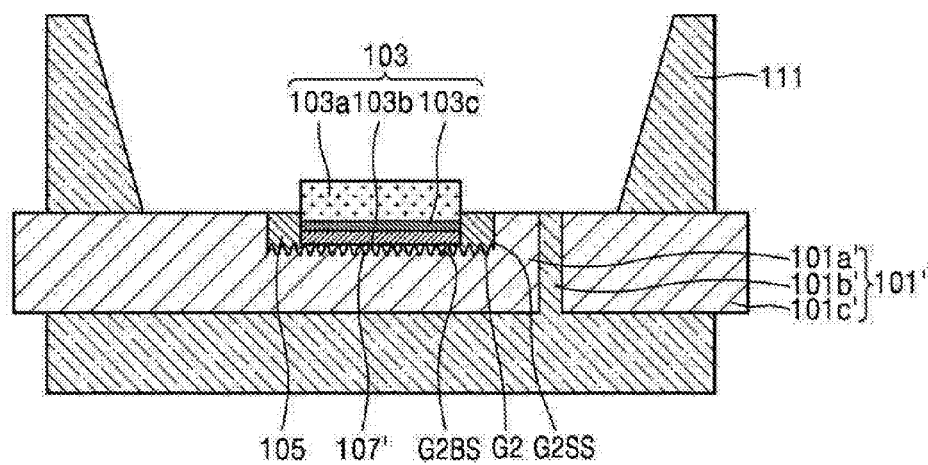

FIGS. 12A to 12C are cross-sectional views that sequentially illustrate a method of manufacturing the light-emitting device package 100b of FIG. 5.

Referring to FIG. 12A, a groove G2 may be formed in a supporting substrate 101' by using a mechanical process, such as a punching process, a forging process, and a shearing process. In this case, irregularities may be formed in the lower surface G2BS of the groove G2. The irregularities may include convex portions and concave portions formed between the convex portions.

Referring to FIG. 12B, a light-emitting device 103 may be on the lower surface G2BS of the groove G2. Since the lower surface G2BS of the groove G2 has the irregularities, an air layer 107' due to the irregularities may be formed between the lower surface of the light-emitting device 103 and the lower surface G2BS of the groove G2.

Referring to FIG. 12C, an adhesive material may be coated in a space between the inner side surface of the groove G2 and the light-emitting device 103. Accordingly, an adhesive layer 105, that fixes the light-emitting device 103 and the inner side of the groove G2, may be formed.

Next, referring to FIG. 12C together with FIG. 5, a wire bonding process may be performed to electrically connect the light-emitting device 103 to the supporting substrate 101'. Next, the encapsulation member 113 for sealing the light-emitting device 103, the adhesive layer 105, and the wire 109 may be formed in the supporting structure 111 to thereby manufacture the light-emitting device package 100b.

Figure 13A:
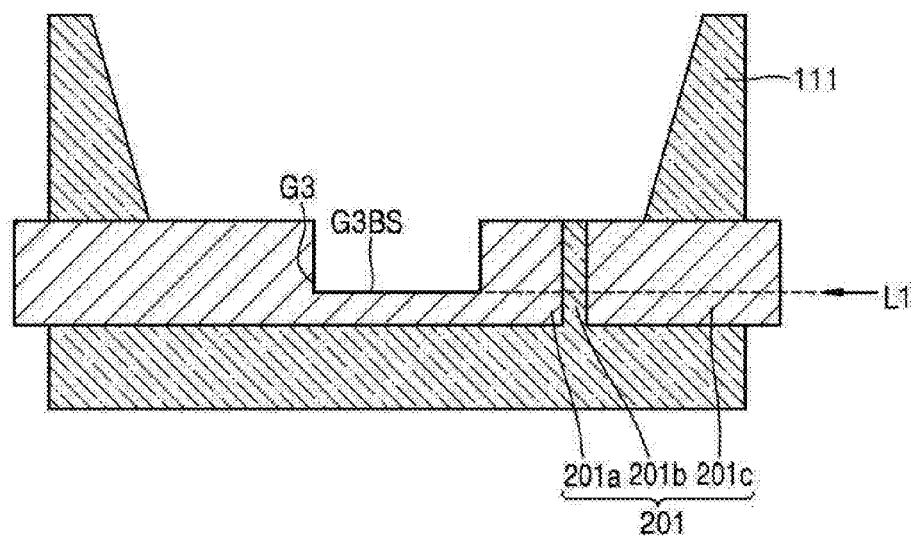
FIGS. 13A to 13C are cross-sectional views that sequentially illustrate a method of manufacturing the light-emitting device package of FIGS. 8A to 8C.
Figure 13B:
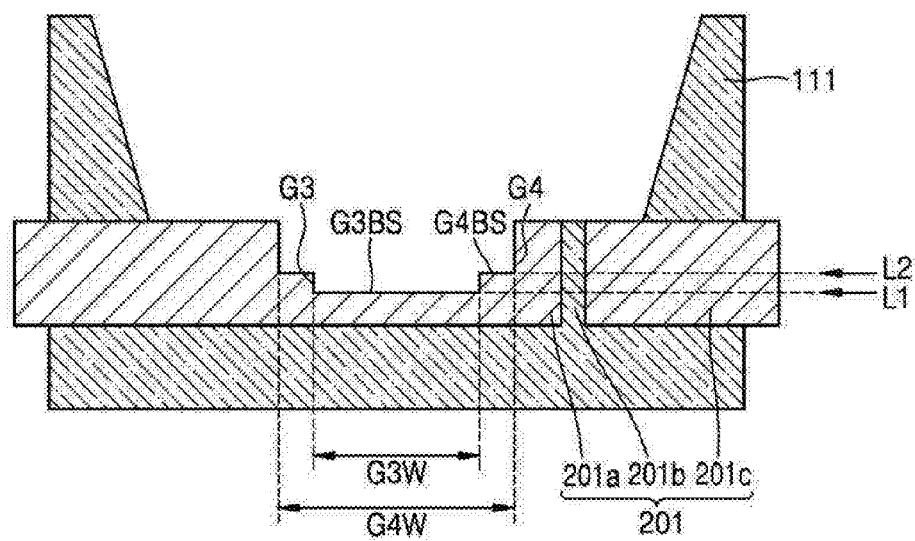
Figure 13C:
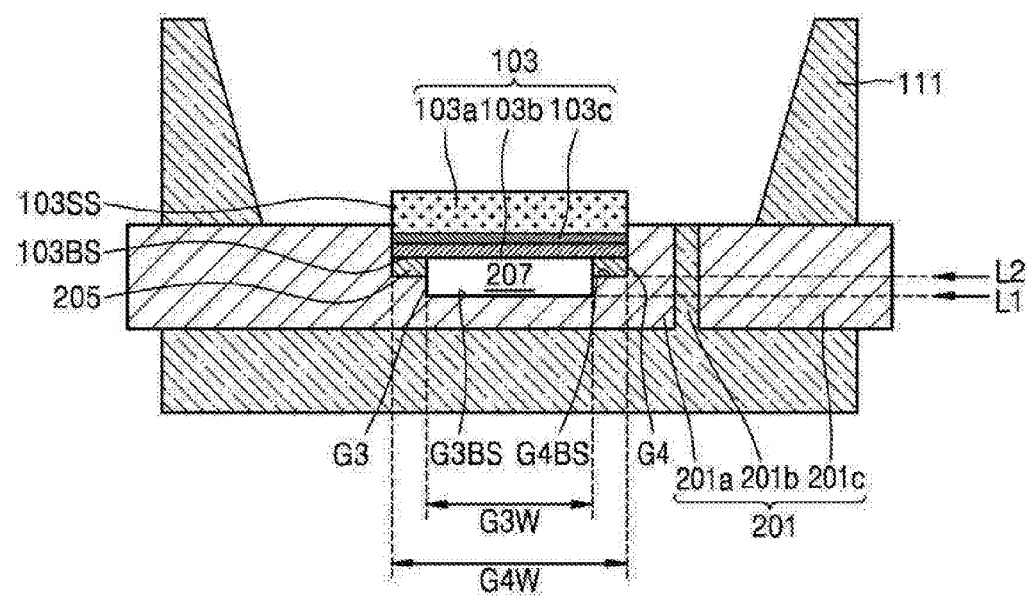

FIGS. 13A to 13C are cross-sectional views that sequentially illustrate a method of manufacturing the light-emitting device package 200 of FIGS. 8A to 8C.

Referring to FIG. 13A, a first groove G3 having a bottom G3BS at a first level L1 is formed in a supporting substrate 201. The first groove G3 may be formed by a mechanical or chemical process as described above.

Referring to FIG. 13B, a second groove G4 overlapping the first groove G3 may be formed. The second groove G4 may have a second width G4W that is wider than a first width G3W of the first groove G3 and have a bottom G4BS at a second level L2 that is higher than the first level L1. Accordingly, the inner side surface of a groove which is formed by the first and second grooves G3 and G4 may have a stair shape.

Referring to FIG. 13C, an adhesive layer 205 may be formed by coating an adhesive material on the bottom G4BS of the second groove G4. Next, a light-emitting device 103 may be place on the second groove G4 coated with the adhesive layer 205.

Next, referring to FIG. 13C together with FIGS. 8A and 8C, a wire bonding process may be performed to electrically connect the light-emitting device 103 to the supporting substrate 201. Next, an encapsulation member 213 for sealing the light-emitting device 103 and a wire may be formed in a supporting structure 111 to thereby manufacture the light-emitting device package 200.

Figure 14:
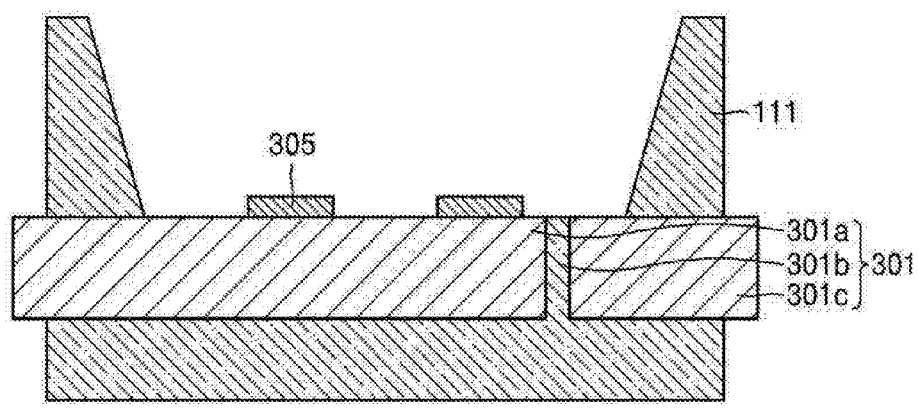
FIG. 14 is a cross-sectional view for describing a method of manufacturing the light-emitting device package of FIGS. 9A to 9C.

FIG. 14 is a cross-sectional view for describing a method of manufacturing the light-emitting device package 300 of FIGS. 9A to 9C.

Referring to FIGS. 9A to 9C and 14, an adhesive material may be coated on the supporting substrate 301 and a loop-shaped adhesive layer 305 having an opening may be formed. Next, a light-emitting device 103 may be on the adhesive layer 305, and the light-emitting device package 300 may be manufactured by performing a bonding process and a molding process, described above.

The light-emitting device package 400 of FIG. 10 may be manufactured by using a method similar to or the same as the method of manufacturing the light-emitting device package 300, described with reference to FIGS. 9A to 9C and 14. However, in this case, a process of forming a groove G4 in the supporting substrate 401 is performed before the adhesive layer 305 is formed. Next, the light-emitting device package 400 of FIG. 10 may be manufacture by performing a subsequent process described with reference to FIG. 14.

While the inventive concepts have been particularly shown and described with reference to example embodiments thereof, it will be understood that various changes in form and details may be made therein without departing from the spirit and scope of the following claims.

What is claimed is:

1. A light-emitting device package comprising:
   a supporting substrate;
   a light-emitting device including a transparent substrate on the supporting substrate and a first conductive semiconductor layer, an active layer, and a second conductive semiconductor layer, sequentially stacked on the transparent substrate;
   an adhesive layer connecting the light-emitting device to the supporting substrate; and
   an air layer between the supporting substrate and the light-emitting device;
   wherein an upper surface of the supporting substrate includes a groove, and the light-emitting device is partially inserted in the groove and is spaced apart from a lower surface of the groove.

2. The light-emitting device package of claim 1, wherein the adhesive layer is formed on at least a portion of a side surface or lower surface of the light-emitting device and connects the light-emitting device to the supporting substrate, and the air layer is formed in a space defined by the supporting substrate, the light-emitting device, and the adhesive layer.

3. The light-emitting device package of claim 1, wherein the light-emitting device is divided into a first region inserted into the groove and a second region not inserted into the groove, and
   the adhesive layer has a loop shape surrounding the first region between a side surface of the first region and an inner side surface of the groove.

4. The light-emitting device package of claim 3, wherein the air layer contacts an entire lower surface of the light-emitting device.

5. The light-emitting device package of claim 3, wherein the inner side surface of the groove has a step-like configuration, and
   the groove includes,
   a first groove region having a first lower surface; and
   a second groove region having a second lower surface at an edge of the first lower surface, the second lower surface being higher than the first lower surface.

6. The light-emitting device package of claim 5, wherein a width of the second groove region is substantially equal to a width of the light-emitting device, and
   the adhesive layer is formed on the second lower surface, and the light-emitting device is on the adhesive layer in the second groove region.

7. The light-emitting device package of claim 1, wherein the adhesive layer has a loop shape comprising an opening between an upper surface of the supporting substrate and a lower surface of the light-emitting device, and
   the light-emitting device is on the adhesive layer and covers the opening.

8. The light-emitting device package of claim 7, wherein in a planar view, an area of a flat surface of the air layer is less than an area of the light-emitting device.

9. The light-emitting device package of claim 7, wherein a contact area between the light-emitting device and the air layer is greater than a contact area between the light-emitting device and the adhesive layer.

10. The light-emitting device package of claim 7, wherein the supporting substrate comprises a groove that communicates with the opening.

11. The light-emitting device package of claim 1, wherein an upper surface of the supporting substrate, which contacts the air layer, comprises irregularities.

12. The light-emitting device package of claim 1, further comprising:
    an encapsulation member that seals the supporting substrate, the adhesive layer, the light-emitting device, and a wire for connecting the light-emitting device to the supporting substrate, wherein the encapsulation member is not formed in the air layer.

13. A light-emitting device package comprising:
a supporting substrate;
a light-emitting device including a transparent substrate on the supporting substrate and a first conductive semiconductor layer, an active layer, and a second conductive semiconductor layer, sequentially stacked on the transparent substrate;
an adhesive layer connecting the light-emitting device to the supporting substrate;
an air layer between the supporting substrate and the light-emitting device; and
a reflective structure under the transparent substrate and contacting the air layer,
wherein the reflective structure includes a distributed Bragg reflector (DBR) structure.

14. A light-emitting package comprising:
a substrate having a groove at an upper surface thereof; and
a light-emitting device on the substrate,
the light-emitting device being partially in the groove to define an air layer separating the substrate from the light-emitting device in a direction perpendicular to a surface of the substrate.

15. The light-emitting package of claim 14, wherein the light-emitting device comprises a light emitting structure, a transparent layer and a reflective layer.

16. The light-emitting package of claim 15, wherein the light emitting structure comprises a first conductive semiconductor layer, an active layer, and a second conductive semiconductor layer.

17. The light-emitting package of claim 14, further comprising:
an adhesive layer connecting the light-emitting device to the substrate in a direction parallel to the surface of the substrate.

18. The light-emitting package of claim 17, further comprising:
an encapsulation member configured to enclose the substrate, the adhesive layer, and the light-emitting device.

* * * * *